United States Patent
Ali et al.

(10) Patent No.: US 10,678,976 B2
(45) Date of Patent: Jun. 9, 2020

(54) GENERIC PROTOCOL ANALYZER FOR CIRCUIT DESIGN VERIFICATION

(71) Applicant: Mentor Graphics Corporation, Wilsonville, OR (US)

(72) Inventors: Mahmoud Mohamed Ali, Giza (EG); Mohamed Abdelsalam Ahmed Hassan, Cairo (EG); Ashraf Mohamed Salem, Heliopolis (EG); Robert John Bloor, Hertfordshire (GB)

(73) Assignee: Mentor Graphics Corporation, Wilsonville, OR (US)

( * ) Notice: Subject to any disclaimer, the term of this patent is extended or adjusted under 35 U.S.C. 154(b) by 197 days.

(21) Appl. No.: 15/873,879

(22) Filed: Jan. 17, 2018

(65) Prior Publication Data

US 2018/0300440 A1    Oct. 18, 2018

Related U.S. Application Data

(60) Provisional application No. 62/485,534, filed on Apr. 14, 2017.

(51) Int. Cl.
| | |
|---|---|
| *G06F 30/30* | (2020.01) |
| *G06F 13/00* | (2006.01) |
| *G06F 30/331* | (2020.01) |
| *G06F 40/14* | (2020.01) |

(52) U.S. Cl.
CPC .............. *G06F 30/30* (2020.01); *G06F 13/00* (2013.01); *G06F 30/331* (2020.01); *G06F 40/14* (2020.01)

(58) Field of Classification Search
CPC .............. G06F 17/5045; G06F 17/5027; G06F 17/2247; G06F 13/00; G06F 30/30; G06F 40/14; G06F 30/331; H04L 43/18
See application file for complete search history.

(56) References Cited

U.S. PATENT DOCUMENTS

| | | | |
|---|---|---|---|
| 6,771,646 B1 * | 8/2004 | Sarkissian | G06F 12/123 370/252 |
| 7,340,705 B1 * | 3/2008 | Massabki | G06F 17/5027 716/111 |
| 7,500,046 B1 * | 3/2009 | Puri | G06F 11/277 710/305 |
| 8,387,067 B2 * | 2/2013 | Prakash | G06F 17/5009 710/2 |
| 8,650,019 B1 * | 2/2014 | Sundararajan | G06F 17/5031 703/13 |
| 9,477,806 B2 * | 10/2016 | Meyer | G06F 17/5045 |
| 10,078,113 B1 * | 9/2018 | Usgaonkar | G06F 11/364 |
| 10,198,539 B1 * | 2/2019 | Lin | G06F 17/5027 |

(Continued)

*Primary Examiner* — Nha T Nguyen

(57) ABSTRACT

Aspects of the disclosed technology relate to techniques for protocol analysis during a circuit design verification process. A protocol-specific message capture unit captures messages while or after being transmitted over one or more communication channels between a circuit design model and one or more target devices. A protocol-independent interface unit receives signals carrying the messages and information for processing the messages from the protocol-specific message capture unit. After processing the messages, the protocol-independent interface unit sends the messages to an analysis unit for analyzing the messages based on a protocol file. The analysis unit may then output the messages for displaying.

27 Claims, 10 Drawing Sheets

(56) References Cited

U.S. PATENT DOCUMENTS

| | | | |
|---|---|---|---|
| 10,296,673 B1 * | 5/2019 | Ghosh | G06F 17/5009 |
| 2006/0052994 A1 * | 3/2006 | Takei | G06F 17/5027 |
| | | | 703/14 |
| 2013/0179855 A1 * | 7/2013 | Elliott | G06F 17/5009 |
| | | | 716/139 |
| 2013/0250767 A1 * | 9/2013 | Zhong | H04L 47/193 |
| | | | 370/235 |
| 2016/0149765 A1 * | 5/2016 | Mittal | H04L 43/18 |
| | | | 703/21 |
| 2018/0113976 A1 * | 4/2018 | Suresh | G06F 13/1673 |

* cited by examiner

Flow chart 1000

GENERIC PROTOCOL ANALYZER FOR CIRCUIT DESIGN VERIFICATION

RELATED APPLICATIONS

This application claims the benefit of U.S. Provisional Patent Application No. 62/485,534, filed on Apr. 14, 2017, and naming Mahmoud Mohamed Ali et al. as inventors, which application is incorporated entirely herein by reference.

FIELD OF THE DISCLOSED TECHNOLOGY

The present disclosed technology relates to the field of circuit design verification technology. Various implementations of the disclosed technology may be particularly useful for verifying networking circuit designs.

BACKGROUND OF THE DISCLOSED TECHNOLOGY

Electronic circuits, such as integrated circuits, are used in a variety of products, from automobiles to smart phones to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators/prototyping devices. The verification processes then are used to identify and correct errors in the design.

The verification processes may also include debugging software programs. Today's system-on-chip (SoC) designs aren't just hardware anymore. In the past, the creation of hardware circuit chips was separate from the creation of the software to be executed on those circuit chips, but today an SoC isn't complete until the intended software has been proven to work—and to work well—on the platform.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Description Language (HDL) (sometimes also referred to as hardware design language or hardware definition language), such as the Very high speed integrated circuit Hardware Description Language (VHDL) or the Verilog language. The logic of the circuit is then analyzed, to confirm that the logic incorporated into the design will accurately perform the functions desired for the circuit. This analysis is sometimes referred to as "functional verification."

Logic simulation is a tool used for functional verification. Designing hardware today involves writing a program in the hardware description language. A simulation may be performed by running that program on a computer. Such an electronic design simulator can determine what the various states of an electronic design would be when presented with some input stimulus. Simulators are commercially available such as the QUESTA family of simulators from Mentor Graphics Corporations of Wilsonville, Oreg.

Software-based simulation, however, may be too slow for large complex designs such as SoC (System-on-Chip) designs. The speed of execution of a simulator drops significantly as the design size increases due to cache misses and memory swapping. Emulation and prototyping significantly increase verification productivity by employing reconfigurable hardware modeling devices including emulators and prototyping devices. Field programmable gate arrays (FPGAs)-based emulators and prototyping devices rely on an actual silicon implementation and perform circuit verification generally in parallel as the circuit design will execute in a real device. By contrast, a simulator performs circuit verification by executing the hardware description code serially. The different styles of execution can lead to orders of magnitude differences in execution time. Examples of hardware emulators include the VELOCE family of emulators available from Mentor Graphics Corporation of Wilsonville, Oreg., the ZEBU family of emulators available from Synopsys, Inc. of Mountain View, Calif., and the PALLADIUM family of emulators available from Cadence Design Systems of San Jose, Calif.

Verifying some circuit designs requires capturing and analyzing messages transmitted between circuit models for these designs and devices they communicated with (often referred to as targets). The communication usually employs a well-defined format or a particular set of rules, which is referred to as a protocol. Multiple protocols may describe different aspects of a single communication. A protocol can be a standard protocol, which has the overwhelming support and agreement of a standards making body, or a user-defined protocol. Examples of standard protocols include PCIe (a protocol for the high-speed serial computer expansion bus standard PCIe), NVMe (a protocol for an open logical device interface specification for accessing non-volatile storage media attached via a PCIe bus), SATA/SAS (a point-to-point serial protocol that moves data to and from computer-storage devices such as hard drives, optical drives, and solid-state drives), USB (a protocol for connection, communication, and power supply between computers and devices through Universal Serial Bus), UFS (a protocol for a common flash storage specification for digital cameras, mobile phones and consumer electronic devices), CAN (a message-based protocol for a bus standard designed to allow microcontrollers and devices to communicate with each other in applications without a host computer), LIN (a serial network protocol used for communication between components in vehicles), Ethernet (a protocol for local area networks (LAN), metropolitan area networks (MAN) and wide area networks (WAN)), Memory DDR (a protocol for Double Data Rate (DDR) memory interface), and Flash Memory (a protocol for flash memory interface).

To capture and analyze messages conforming to different protocols during a circuit design verification process, different protocol analyzers are typically employed. With so many existing protocols and with more new protocols are under development, a generic protocol analyzer that can be made to work with various protocols easily and quickly is highly desirable.

BRIEF SUMMARY OF THE DISCLOSED TECHNOLOGY

Aspects of the disclosed technology relate to techniques for protocol analysis during a circuit design verification process. In one aspect, there is a system for analyzing and outputting data traffic over one or more communication channels between a circuit design model implemented using a hardware description language (HDL) and one or more target devices of the circuit design model, comprising: a protocol-independent interface unit comprising a first subunit implemented using the hardware description language and a second subunit implemented using a high-level language such as a hardware verification language (HVL), the first subunit comprising one or more buffers and being configured to receive signals from a protocol-specific message capture unit implemented using the hardware description language, the signals comprising at least one signal carrying messages and signals carrying information for processing the messages by the protocol-independent interface unit, the messages conforming to a protocol and being captured by the protocol-specific message capture unit while or after being transmitted over the one or more communication channels, the first subunit also configured to buffer the messages in the one or more buffers, the second subunit configured to receive the messages from the first subunit and to send out the messages; and an analysis unit implemented in a computer and configured to receive the messages from the second subunit and to output the messages based on a protocol file for the protocol.

The system may further comprise: a display unit configured to display the outputted messages. The signals carrying information for processing the messages may comprise a first signal indicating a start of a message, a second signal indicating an end of a message and a clock signal.

The outputting by the analysis unit may comprise: decoding the messages according to rules listed in the protocol file for the protocol; and sending out the decoded messages to a display unit for displaying according to GUI (graphic user interface) layout information extracted from the protocol file for the protocol.

The circuit design model, the first subunit and the protocol-specific message capture unit may be implemented in a reconfigurable hardware modeling device. The reconfigurable hardware modeling device may be a hardware emulator or an FPGA-based prototyping device.

The protocol may be a standard protocol or a user-defined packet-based protocol. The second subunit may send out the messages using TCP/IP (Transmission Control Protocol and Internet Protocol). The protocol file for the protocol may be an XML (Extensible Markup Language) file.

The first subunit may send the messages to the second subunit using a one-way import DPI (Direct Programming Interface) call and the second subunit may perform a flow control.

The signals may further comprise signals carrying second information for analyzing the messages by the analysis unit. The second information may be added as a header section to the messages. The analyzing may comprise combining the messages received from different channels into a single message. Alternative or additionally, the analyzing comprises outputting the messages to be displayed in different GUI (graphic user interface) panes.

In another aspect, there is a method, comprising: capturing, by a protocol-specific message capture unit, messages conforming to a protocol while or after being transmitted over one or more communication channels between a circuit design model and one or more target devices of the circuit design model, both the circuit design model and the protocol-specific message capture unit implemented using a hardware description language (HDL); processing the messages by a protocol-independent interface unit based on signals received from the protocol-specific message capture unit, wherein the protocol-independent interface unit comprises a first subunit implemented using the hardware description language (HDL) and a second subunit implemented using a high-level language such as a hardware verification language (HVL), the first subunit configured to receive signals from the protocol-specific message capture unit, the signals comprising signals carrying the messages and signals carrying information for processing by the protocol-independent interface unit, and wherein the processing comprises: buffering the messages in one or more buffers in the first subunit, receiving the messages by the second subunit from the first subunit, and sending out the messages by the second subunit; and analyzing, by an analysis unit running in a computer, the messages received from the second subunit, wherein the analyzing comprises: outputting the messages based on a protocol file for the protocol.

The method may further comprise displaying the messages outputted by the analysis unit on a display unit. The displaying may be according to GUI (graphic user interface) layout information extracted by the analysis unit from the protocol file for the protocol.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1A:
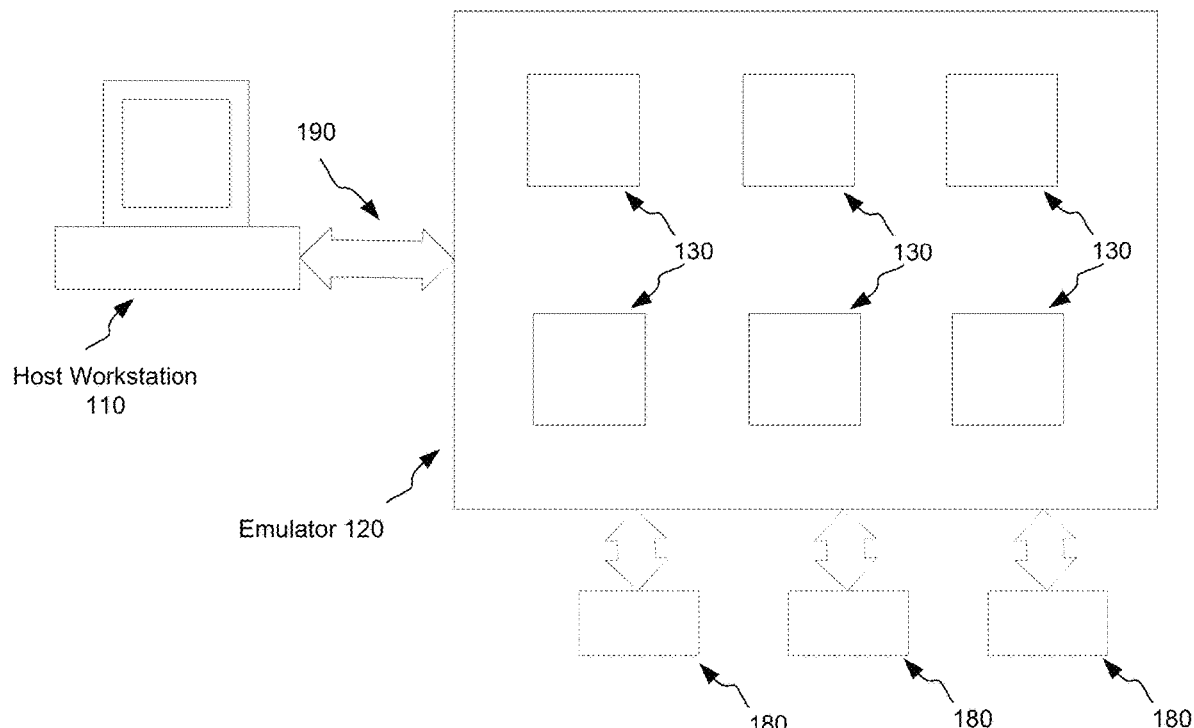
FIG. 1A shows an illustrative example of an emulation system with an emulator being coupled to targets.

Various aspects of the present disclosed technology relate to techniques for protocol analysis during a circuit design verification process. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "process", "send" and "analyze" to describe the disclosed methods/systems. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Hardware Modeling Environment

Reconfigurable hardware modeling devices can be emulators or prototyping devices. Two types of emulators have been developed. The first type is FPGA-based. In an FPGA-based architecture, each FPGA chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route are performed on the FPGA chips in a way that preserves the connectivity in the original circuit design.

The programmable logic chips employed by an emulator may be commercial FPGA chips or custom-designed emulation chips containing programmable logic blocks. A custom FPGA-based emulator can have a specially designed internal interconnection network of programmable elements within each custom FPGA, an external interconnecting network and I/O structure of custom FPGAs, and a design-under-test debug engine. Such architecture enables, compared to a commercial FPGA-based counterpart, fast and correct-by-construction compilation and high design visibility in the silicon fabric that assumes 100% access without probe compilation and rapid waveform tracing. A commercial FPGA chip may have somewhat larger capacity density than a custom FPGA chip. For a given design, a custom FPGA-based emulator may need more FPGAs than a commercial FPGA-based emulator, leading to larger physical dimensions and higher power consumption.

The second type of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. The compilation speed of a processor-based emulator, however, is much faster than those of a FPGA-based emulator. Drawbacks are limited speed of execution in a transaction-based mode, large power consumption, and large physical dimensions compared to a FPGA-based emulator.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is often not fast enough to run at the same speed of the physical target system (a few megahertz vs hundreds of megahertz). Speed rate adapters may be introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols may make timely rate adapter development difficult.

In an acceleration mode, the physical target system is replaced by a virtual target system modelled via one of the high-level languages such as SystemVerilog, SystemC, or C++. The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange is through so-called transactors. A transactor, including a front-end proxy interface on the workstation or host computer, a back-end bus-functional model on the emulator and a physical communication channel between the host computer and the emulator, converts high-level commands from the testbench on the host computer into signal-level bit sequences required by the design-under-test model on the emulator, and vice versa. This allows data being streamed and buffered between the testbench and the design-under-test, speeding up the execution of the testbench. A design team can thus access the full performance of the emulator. In addition to performance, the transaction-based emulation eliminates the need for rate adapters. The design-under-test can connect to a "virtual device" (a software model of the device) that runs on the host computer through a transaction-level interface or to a physical device through a transaction-level interface and a "virtual device" acting as a bridging device.

In addition to emulators, reconfigurable hardware modeling devices also include FPGA prototyping devices. FPGA prototyping is typically deployed near the end of the verification process to catch system-level issues. For designs that rely heavily on commercial intellectual property (IP), an FPGA-based prototype is an ideal test platform for ensuring all IP components perform together. An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Compared to FPGA-based emulators which typically operate at one to two million cycles per second, FPGA prototypes are designed and built to achieve the highest speed of execution possible, allowing the extension of the speed range into tens of megahertz. The downside to FPGA prototyping is capacity limitations, limited debugging capabilities and long bring-up time. With growing complexity of FPGAs and advancement in both emulation and prototyping technologies, the lines between FPGA-based prototyping and emulation are increasingly blurring.

In some embodiments, the disclosed technology may be implemented as part of a hardware emulation environment, such as the one illustrated in FIG. 1A. As seen in this figure, the hardware emulation environment includes an emulator 120 coupled to a host computer or workstation 110. The workstation 110 may be implemented by one or more computing systems. One computing system may include a single computer or multiple computers (e.g., a master computer and a plurality of slave computers). The workstation provides the capability to load the DUV (design-under-verification, also referred to as DUT—design under test) model into the emulator, controls the execution of the DUT model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the workstation 110 and loaded to the emulation circuit boards 130 for emulation.

In the in-circuit emulation mode, one or more targets 180 may be coupled to the emulator 120 as shown in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
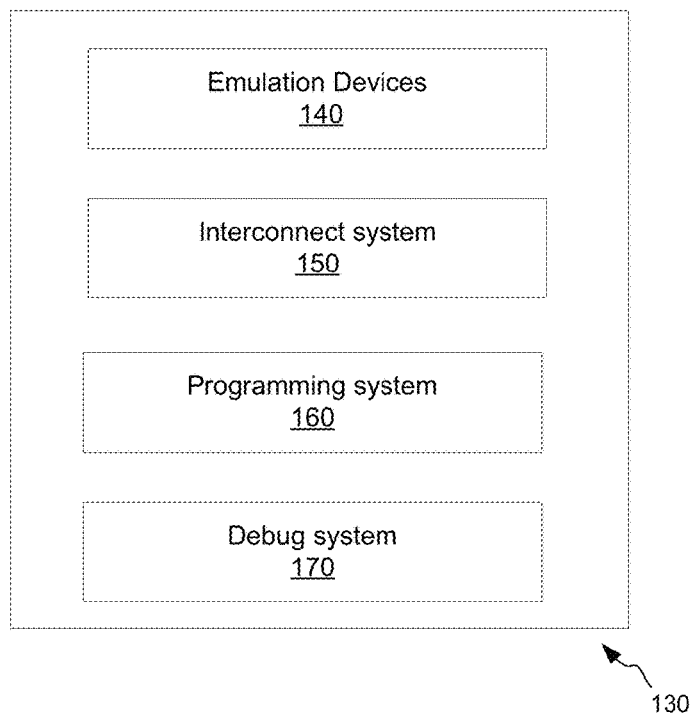
FIG. 1B shows an illustrative example of an emulation circuit board.

FIG. 1B illustrates an example of an emulation circuit board 130. The emulation circuit board 130 includes an array of emulation devices 140. The emulation devices 140 can be programmed to model, for example, combinatorial logic components, sequential circuit components and memories. The emulation devices 140 may be processor-based or FPGA-based.

Also included in the emulation circuit board 130 are a configurable interconnect system 150, a programming system 160, and a debug system 170. A portion of a circuit design on one emulation device may need data computed by another portion of the design on another emulation device. The configurable interconnect system 150 allows data to be moved between emulation devices 140. In some implementations, the configurable interconnect system 150 may include a cross-bar device, a multiplexer, some other configurable network, or any combination thereof.

The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140.

The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model (e.g., FPGA configuration bitstreams), initial contents of registers and design memories and data for debugging purposes. This interface is independent of design-under-test and may comprise dedicated logic or programmed logic in the emulator.

The interface system may also comprise one or more transaction-level interfaces. These interfaces may be optimized for small packets of data and fast streaming speed. The speed may be, for example, in the order of 2-3 Gigabits per second. The communication is performed through transactors as discussed previously. A transactor includes a backend bus-functional model—instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Illustrative Computer-Based Operating Environment

Figure 2:
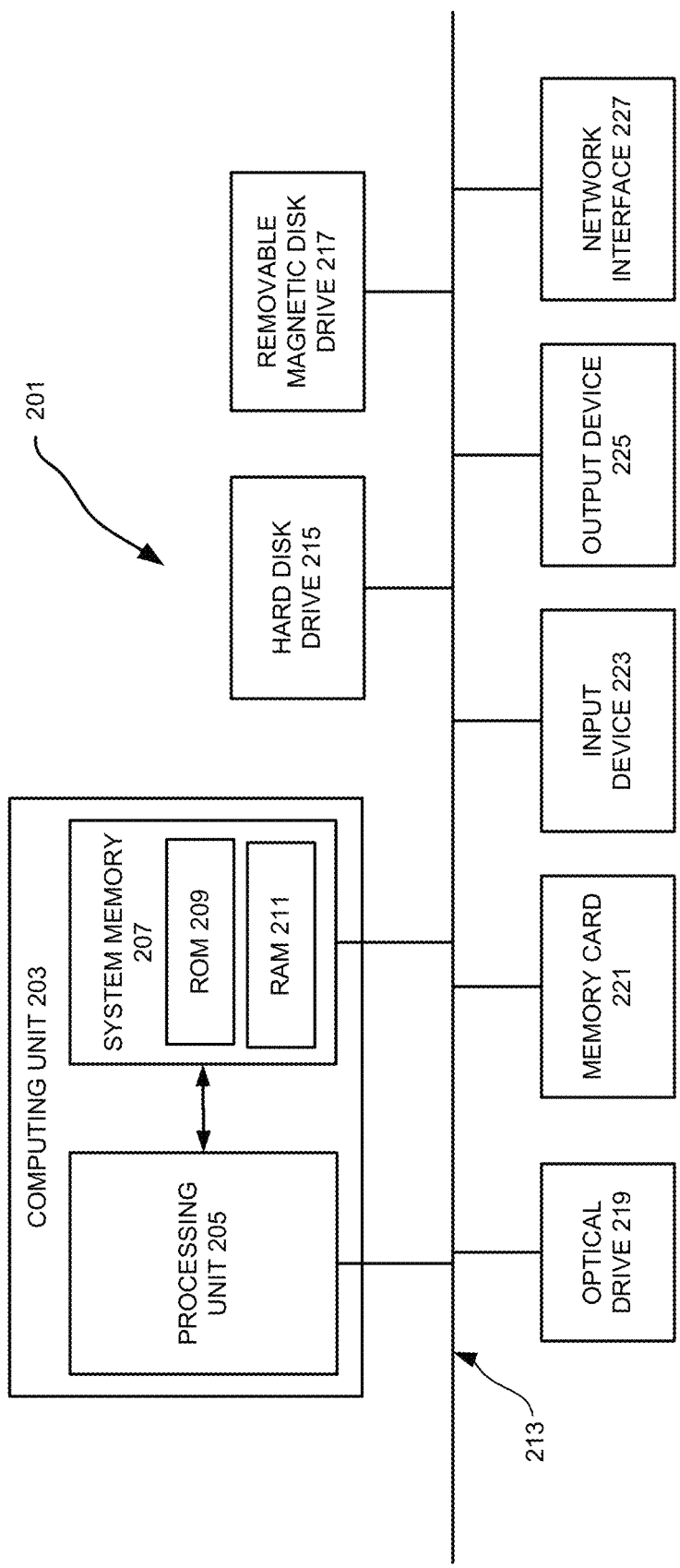
FIG. 2 illustrates a programmable computer system with which various embodiments of the disclosed technology may be employed.

FIG. 2 shows an illustrative example of a computing device 201 which may serve as the workstation 110 and/or implement various embodiments of a part or whole of the disclosed technology. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 103 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and it not intended to be limiting. Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multi-processor computer, a plurality of single and/or multiprocessor computers arranged into a network, or some combination of both.

Generic Protocol Analyzer

Figure 3:
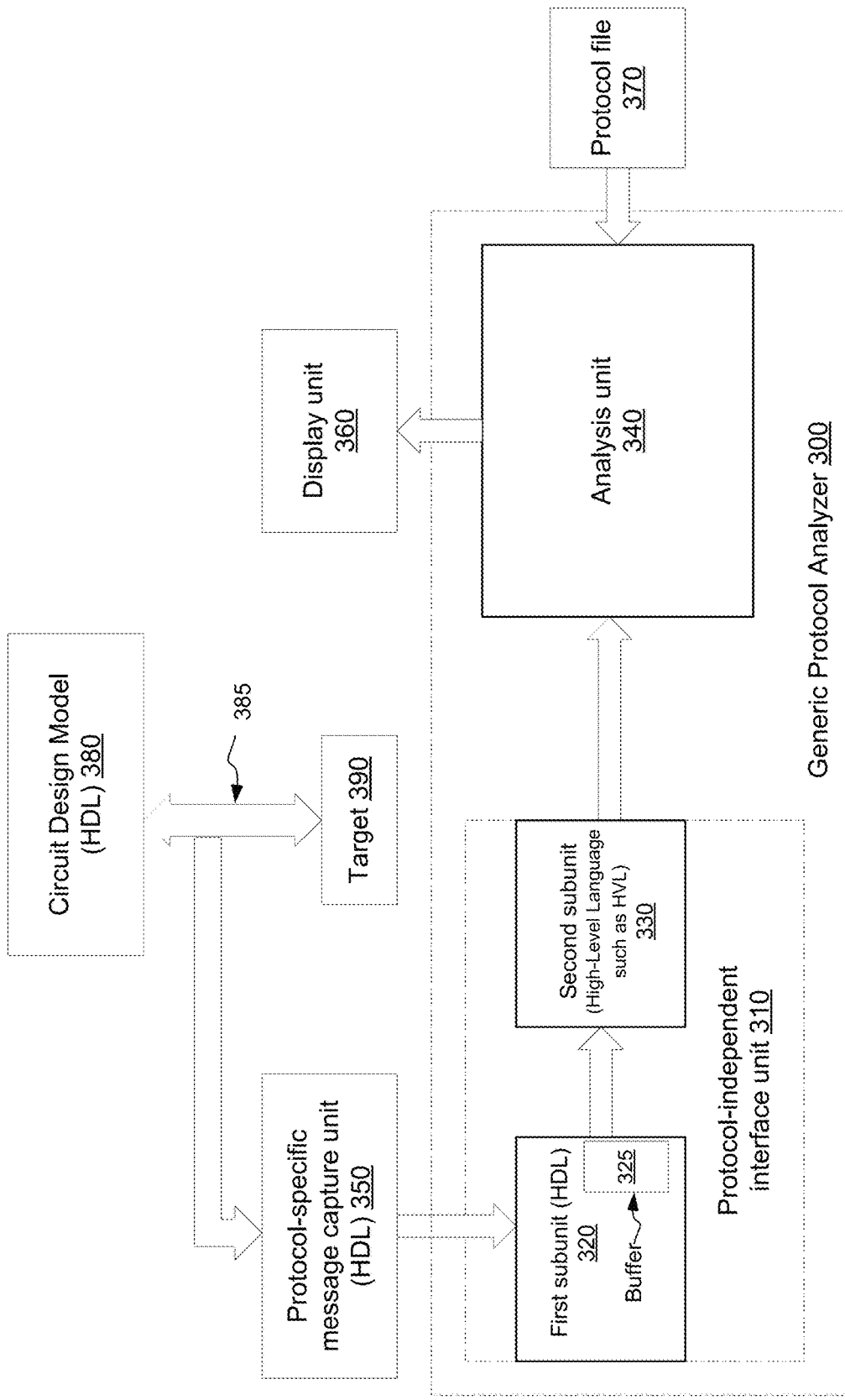
FIG. 3 illustrates an example of a generic protocol analyzer for circuit design verification that may be employed by various embodiments of the disclosed technology.

FIG. 3 illustrates an example of a generic protocol analyzer 300 for circuit design verification that may be employed by various embodiments of the disclosed technology. The generic protocol analyzer 300 comprises a protocol-independent interface unit 310 and an analysis unit 340. The protocol-independent interface unit 310 comprises a first subunit 320 implemented using a hardware description language (HDL) and a second subunit 330 implemented using a high-level language such as C, C++, SystemC, SystemVerilog, OpenVera, or e. The generic protocol analyzer 300 may further comprise or cooperate with a display unit 360.

The first subunit 320, comprising one or more buffers 325, is configured to receive signals from a protocol-specific message capture unit 350. The signals comprise signals carrying messages captured by the protocol-specific message capture unit 350 while or after the messages are transmitted over one or more communication channels 385 between a circuit design model 380 and one or more target devices 390. The signals further comprise signals carrying information for processing the messages by the protocol-independent interface unit 310. The communication between a circuit design model 380 and one or more target devices 390 conforms to a protocol. The protocol can be a standard protocol or a user-defined packet-based protocol. The standard protocol can be one of those mentioned in the section of Background of the Disclosed Technology or any standard protocol. The first subunit 320 is also configured to buffer the messages in the one or more buffers 325. The protocol-specific message capture unit 350 may further be configured to monitor/detect communications over the one or more communication channels 385 for capturing the messages.

Like the first subunit 320, both the protocol-specific message capture unit 350 and the circuit design model 380 are also implemented using the hardware description language. In a hardware-based verification process, all of the first subunit 320, the protocol-specific message capture unit 350 and the circuit design model 380 can be implemented in an emulation system such as the one shown in FIGS. 1A and 1B. In a simulation-based verification process, all of the first subunit 320, the protocol-specific message capture unit 350 and the circuit design model 380 can be implemented in a computer system such as the one shown in FIG. 2.

The second subunit 330 is configured to receive the messages from the first subunit and to send out the messages. The messages may be sent out using the TCP/IP (Transmission Control Protocol and Internet Protocol). With some implementations of the disclosed technology, the first subunit sends the messages to the second subunit using a one-way import DPI (Direct Programming Interface) call and the second subunit performs a flow control.

The analysis unit 340 is configured to receive the messages from the second subunit 330 and to output the messages based on a protocol file for the protocol 370. According to some embodiments of the disclosed technology, the outputting comprises: decoding the messages according to rules listed in the protocol file for the protocol 370; and sending out the decoded messages to a display unit for displaying according to GUI (graphic user interface) layout information extracted from the protocol file 370. The output may be displayed on the display unit 360. Additionally or alternatively, the output may be stored in a storage device.

The second subunit 330 and the analysis unit 340 are implemented in the same computer system or two separate computer systems, such as the computer system shown in FIG. 2.

While FIG. 3 shows only a pair of the first subunit 320 and the second subunit 330, the protocol-independent interface unit 310 can comprise multiple such pairs, of which each may be used for one of the one or more communication channels 385.

Figure 4:
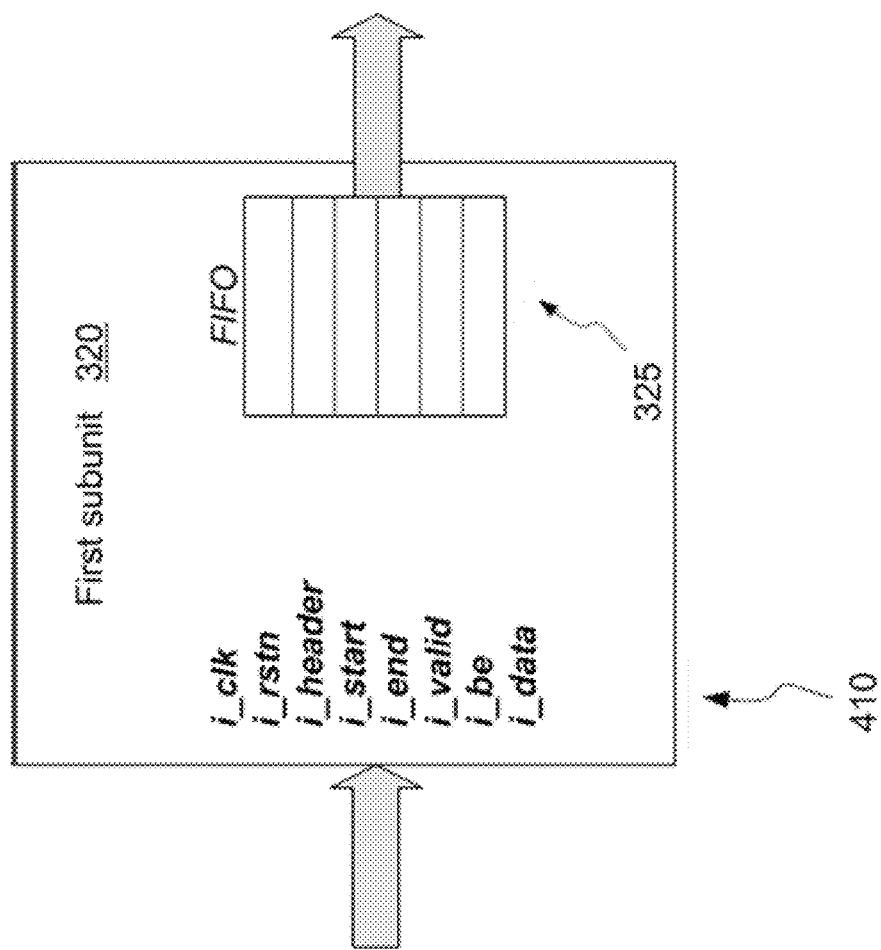
FIG. 4 illustrates an example of the first subunit of the protocol-independent interface unit having eight input ports for receiving signals from the protocol-specific message capture unit and a first-in first-out buffer for buffering the messages.
Figure 5:
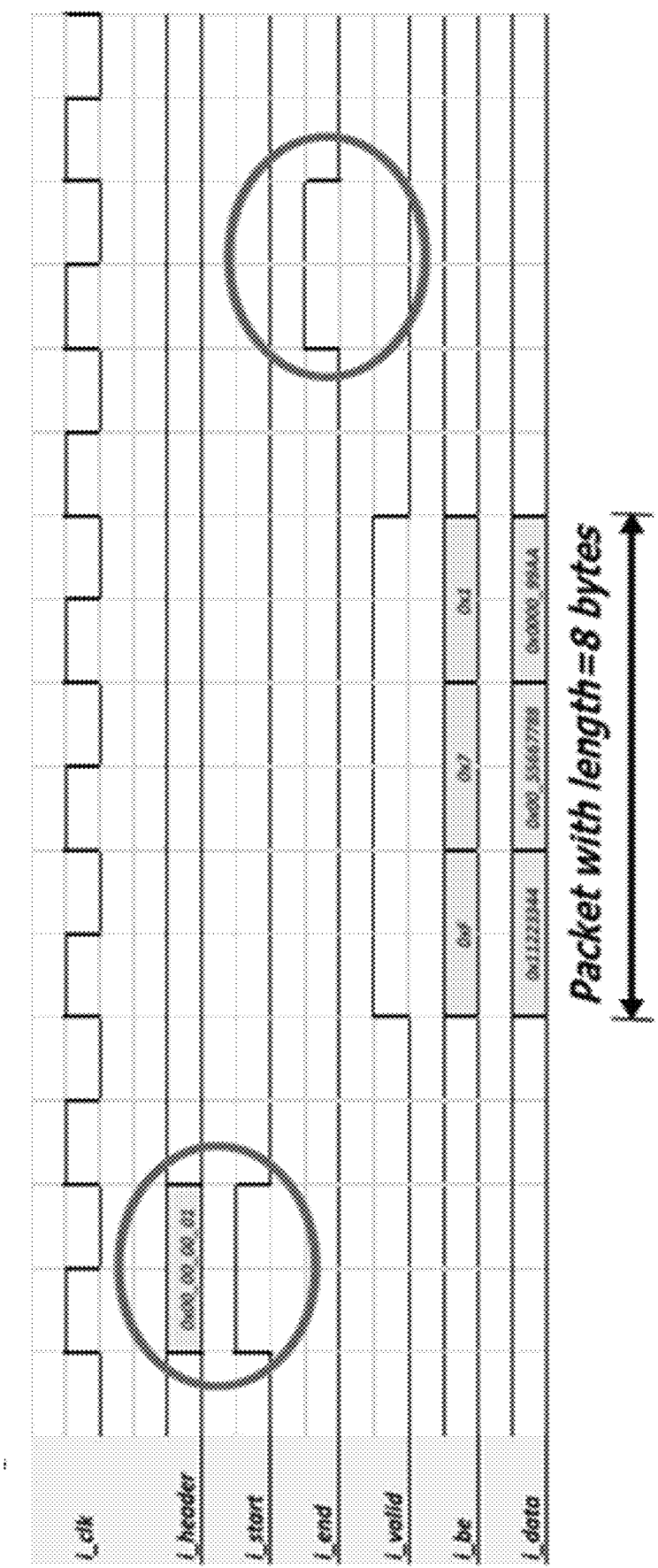
FIG. 5 illustrates an example of a timing diagram of the signals received by the protocol-independent interface unit.

Using the information carried by the signals received from the protocol-specific message capture unit 350 and the protocol file 370, the generic protocol analyzer 300 can process and analyze messages or packets conforming to a particular protocol (here, the protocol). In addition to the signals carrying the message and information for processing the messages by the protocol-independent interface unit 310, the signals may further comprise signals carrying information for analyzing the messages by the analysis unit. An example of the signals is illustrated in FIGS. 4 and 5. FIG. 4 shows an example of the first subunit 320 having eight input ports 410 and a first-in first-out buffer 325. FIG. 5 shows a timing diagram of the signals generated by the protocol-specific message capture unit 350 (i_clk, i_rstn, i_header, i_start, i_end, i_valid and i_be) and a signal carrying the messages captured by the protocol-specific message capture unit 350 (i_data).

Among these signals shown in FIGS. 4 and 5, the i_clk is a clock signal, the i_start signal is asserted to indicate the start of a packet and the i_end signal is asserted at the end of a packet. During this time window, the i_be is used to signal to specify the packet length and the i_valid signal is used to indicate a valid data on the communication channel. In FIG. 5, the message packet has a length of eight bytes and is divided into three segments indicated by the i_be signal. The i_header can carry information to be used by the analysis unit 340 for analyzing the messages as will be discussed in detail below. This information may be added as a header section to the messages. The header section may include message identification number, pane identification number, message direction, and message attributes. The message attributes indicate type of message which can be either: complete packet, first packet of a large split packet, last packet of a large split packet, or part of large split packet.

Figure 6:
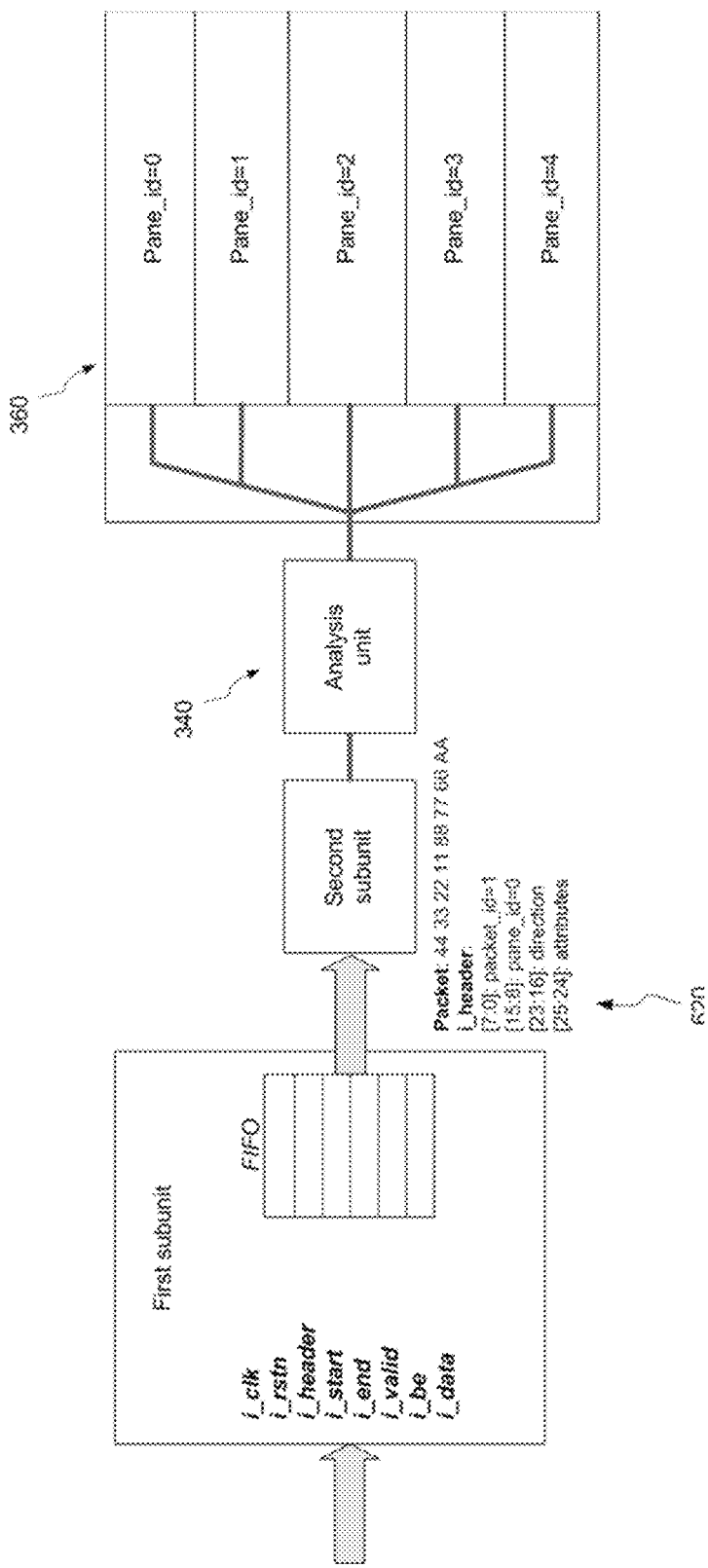
FIG. 6 illustrates an example of routing the messages to different display panes by the analysis unit based on the information added as a header section to the messages captured by the protocol-specific message capture unit.

FIG. 6 illustrates an example of processing the messages by the analysis unit 340 based on the information added as a header section 620 to the messages captured by the protocol-specific message capture unit 350 (not shown). In this example, the analysis unit 340 outputs the messages to be displayed in different GUI (graphic user interface) panes on the display unit 360 based on an attribute "pane_id" in the header section 620. The header section 620 shows in the figure that the current packet belongs to pane_id=0. Accordingly, it will be displayed at the top pane of the GUI pane. The number of trace panes that need to be created for a given protocol may be defined by the protocol file 370.

Figure 7:
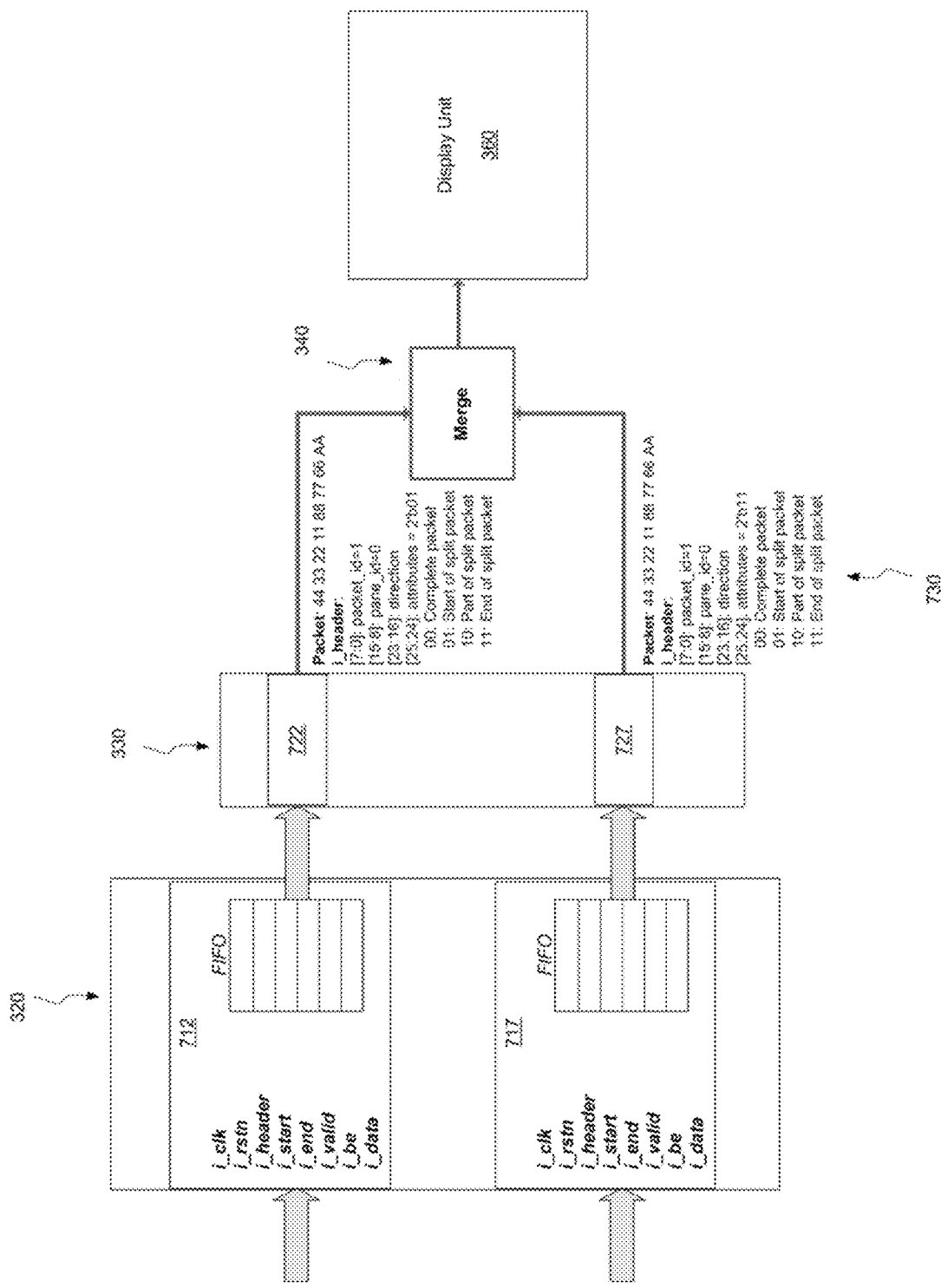
FIG. 7 illustrates an example of combining the messages received from different channels into a single message by the analysis unit based on the information added as a header section to the messages captured by the protocol-specific message capture unit.

FIG. 7 illustrates another example of processing the messages by the analysis unit 340 based on the information added as a header section 730 to the messages captured by the protocol-specific message capture unit 350 (not shown). In some protocols, a protocol packet is split into segments to be transmitted over several bus channels. A user would like to see all of the packet segments in the protocol analyzer GUI as a whole. In the example shown in FIG. 7, the analysis unit 340 combines the messages received from different channels into a single message. More specifically, messages from two different channels are by subunit pairs 712/722 and 717/727, respectively, combined by the analysis unit 340, and displayed on the display unit 360. A header section 730 may include a start of split and end of split packet attributes to indicate the beginning and end of packet segments. Other attributes could be complete packet or part of split packet to indicate a full packet payload or partial packet payload respectively.

Figure 8:
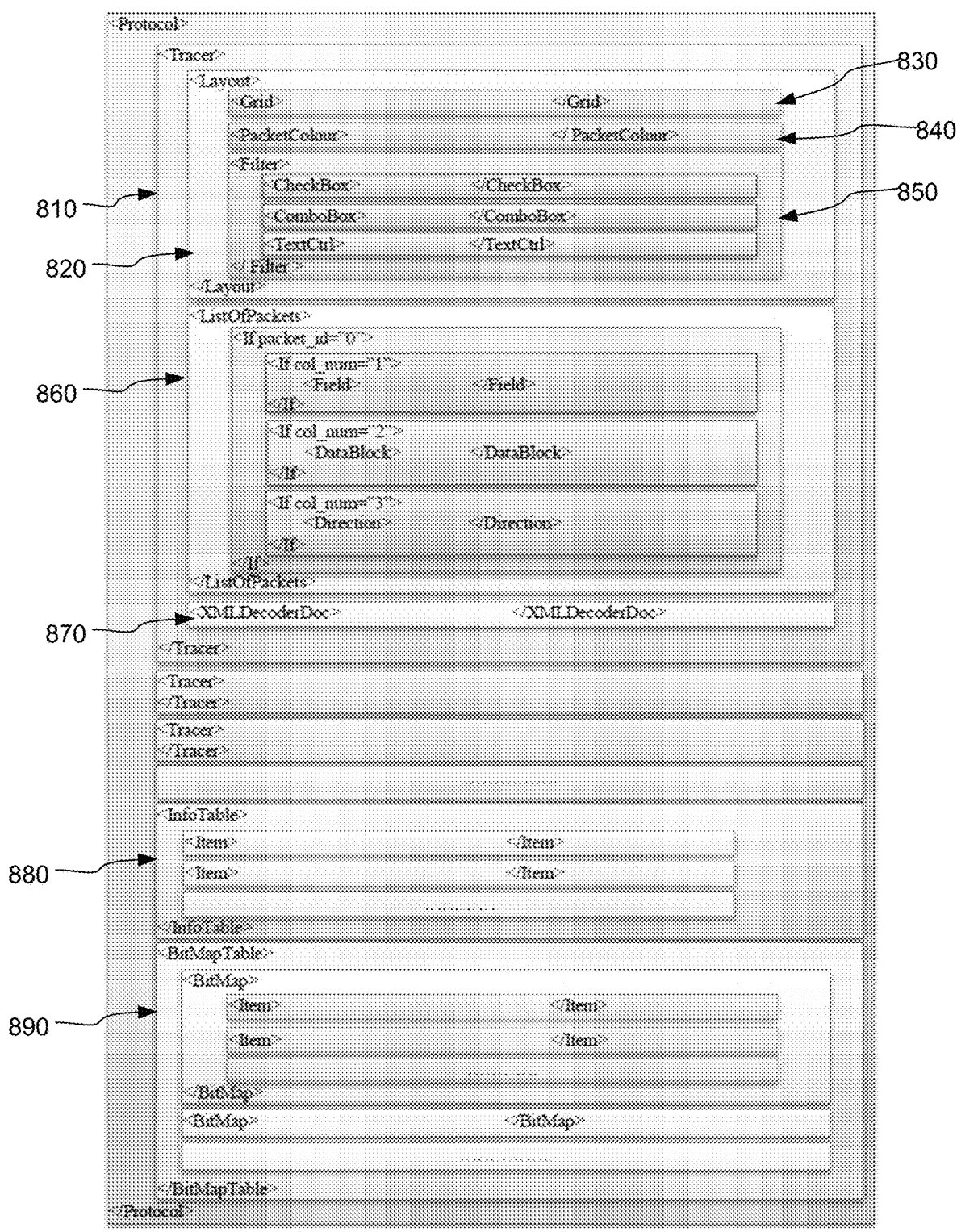
FIG. 8 illustrates an example of the protocol file.
Figure 9:
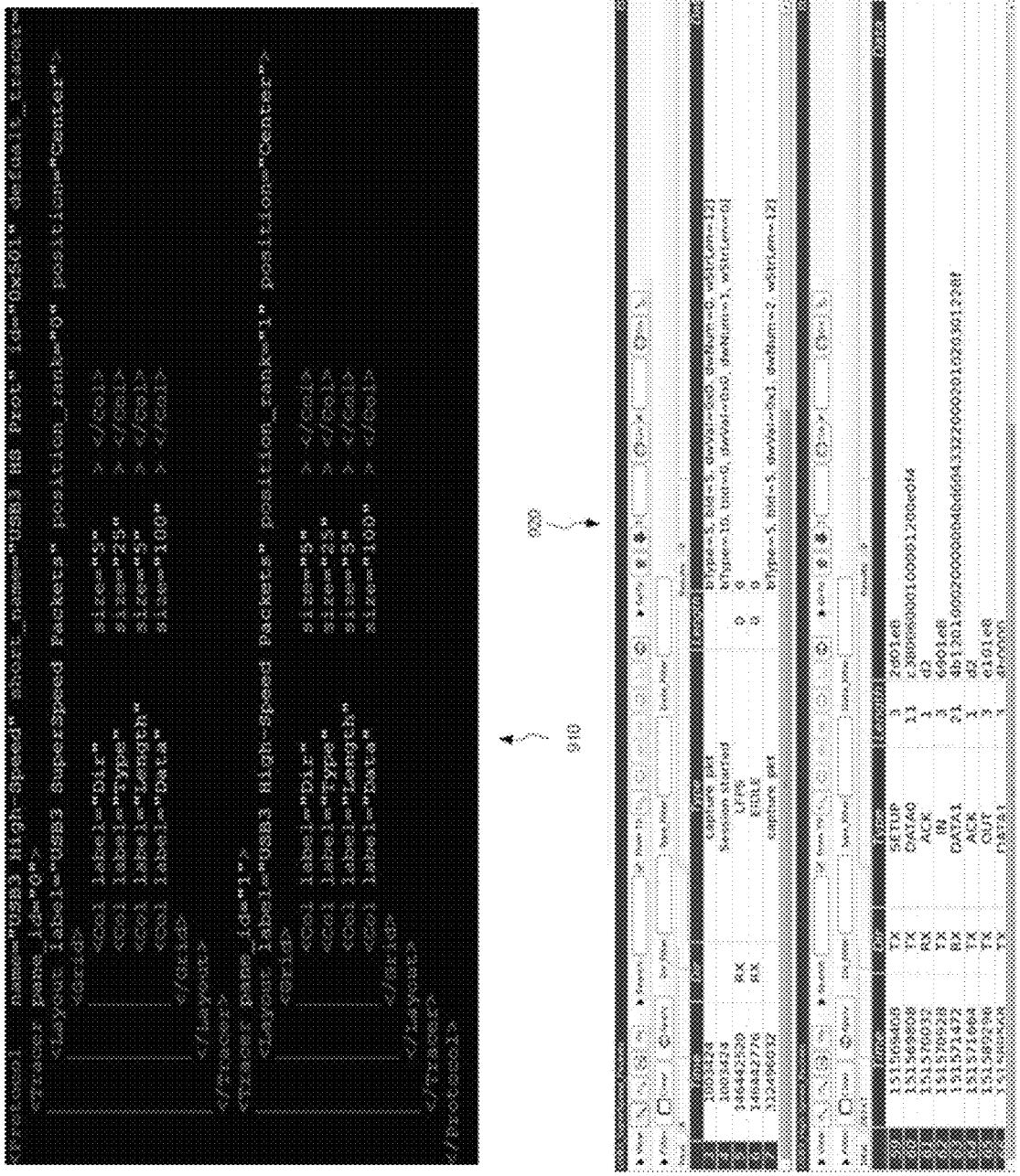
FIG. 9 illustrates an example how to describe GUI layout in the XML file and an example of a table generated accordingly.

The protocol file 370 used by the analysis unit 340 may be an XML (Extensible Markup Language) file. FIG. 8 illustrates an example of the protocol file 370. The protocol file 370 here includes information about how to draw and construct the GUI layout of the protocol and tell the analyzer unit 340 how to intercept the protocol packets, decode and display them. The structure of the XML file comprises Tracer element(s) 810 which creates a trace pane in the protocol GUI session, and each pane has a unique identification (pane_id) which is used in packet routing; Layout element(s) 820 which contains GUI layout information; Grid element 830 which describes labels of the trace pane columns; Packet Color 840 which highlights certain packets with different color; Filter element 850 which is used to add a filter toolbar items to the trace pane (three items: CheckBox, ComboBox, and TextCtrl are shown here); ListOfPackets element 860 which is used to direct the protocol analyzer engine on how to decode and intercept the received packets, and users shall define the decoding rules associated with the packet identification and can use the Field or DataBlock or Direction to inform the analysis unit 340 the field contents of the packet in order to display the packet in the proper format; XMLDecoderDoc element 870 which is used to declare the type of protocol to decode; InfoTable element 880 which is used to define the configuration and parameters of the protocol inside a table panel; and BitMapTable element 890 which is used to describe the map tables to correlate bitmap fields in a data packet with register names. FIG. 9 illustrates an example how to describe GUI layout in the XML file (910) and an example of a table generated accordingly (920).

Figure 10:
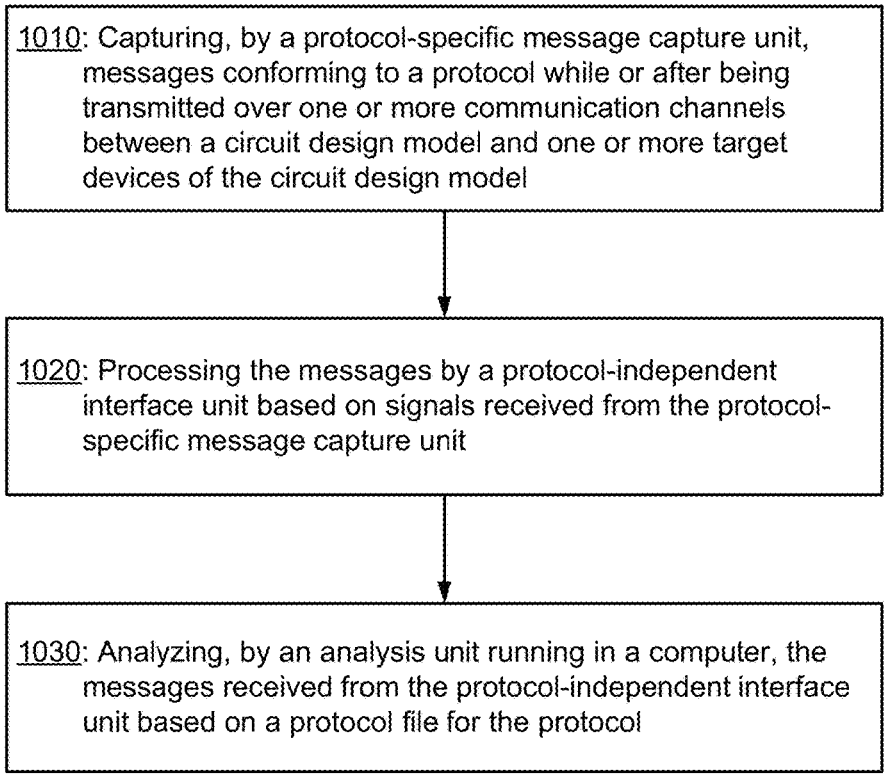
FIG. 10 illustrates a flowchart showing a protocol analysis process for circuit design verification that may be implemented according to various examples of the disclosed technology.
Figure 10:

FIG. 10 illustrates a flowchart 1000 showing a protocol analysis process for circuit design verification that may be implemented according to various examples of the disclosed technology. For ease of understanding, methods of protocol analysis for circuit design verification that may be employed according to various embodiments of the disclosed technology will be described with reference to the generic protocol analyzer 300 in FIG. 3 and the flow chart 1000 illustrated in FIG. 10. It should be appreciated, however, that alternate implementations of a generic protocol analyzer 300 may be used to perform the methods of protocol analysis illustrated by the flow chart 1000 according to various embodiments of the disclosed technology. Likewise, the generic protocol analyzer 300 may be employed to perform other methods of protocol analysis according to various embodiments of the disclosed technology.

In operation 1010 of the flowchart 1000, the protocol-specific message capture unit 350 captures messages while or after the messages are transmitted over one or more communication channels between a circuit design model and one or more target devices of the circuit design model. The messages conform to a protocol, which may be a standard protocol or a user-defined protocol. Both the circuit design model and the protocol-specific message capture unit implemented using a hardware description language (HDL).

In operation 1020, the protocol-independent interface unit 310 processes the messages by based on signals received from the protocol-specific message capture unit 350. The protocol-independent interface unit 310 comprises a first subunit 320 implemented using the hardware description language (HDL) and a second subunit 330 implemented using a high-level language such as a hardware verification language (HVL). The first subunit 320 is configured to receive signals from the protocol-specific message capture unit 350. The signals comprise signals carrying the messages and signals carrying information for processing by the protocol-independent interface unit 310.

The processing by the protocol-independent interface unit 310 comprises: buffering the messages in one or more buffers in the first subunit 320, receiving the messages by the second subunit 330 from the first subunit 320; and sending out the messages by the second subunit 330. The second subunit 330 may send out the messages using the TCP/IP (Transmission Control Protocol and Internet Protocol).

In operation 1030, the analysis unit 340 running in a computer analyzes the messages received from the second subunit 330. The analyzing comprises: outputting the messages based on the protocol file for the protocol 370. The protocol file for the protocol 370 may be an XML (Extensible Markup Language) file. The protocol file 370 may include information about how to draw and construct the GUI layout of the protocol and tell the analyzer unit 340 how to intercept the protocol packets, decode and display them. An example of the protocol file is shown in FIG. 8.

The signals received by the protocol-independent interface unit 310 may further comprise one or more signals carrying second information for analyzing the messages by the analysis unit 340. This second information may be added as a header section to the messages. The analysis unit 340 may, for example, combine the messages received from different channels into a single message based on the one or more signals. Additionally or alternatively, the analysis unit 340 may output the messages to be displayed in different GUI (graphic user interface) panes based on the one or more signals.

In an additional operation, the display unit 360 displays the messages outputted by the analysis unit 340.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A system for analyzing and outputting data traffic over one or more communication channels between a circuit design model implemented using a hardware description language (HDL) and one or more target devices of the circuit design model, comprising:
    a protocol-independent interface unit comprising a first subunit implemented using the hardware description language and a second subunit implemented using a high-level language, the first subunit comprising one or more buffers and being configured to receive signals from a protocol-specific message capture unit implemented using the hardware description language, the signals comprising at least one signal carrying messages and signals carrying information for processing the messages by the protocol-independent interface unit, the messages conforming to a protocol and being captured by the protocol-specific message capture unit while or after being transmitted over the one or more communication channels, the first subunit also configured to buffer the messages in the one or more buffers, the second subunit configured to receive the messages from the first subunit and to send out the messages; and
    an analysis unit implemented in a computer and configured to receive the messages from the second subunit and to output the messages based on a protocol file for the protocol.

2. The system recited in claim 1, further comprising a display unit configured to display the outputted messages; and
    wherein the outputting by the analysis unit comprises:
        decoding the messages according to rules listed in the protocol file for the protocol; and
        sending out the decoded messages to a display unit for displaying according to GUI (graphic user interface) layout information extracted from the protocol file for the protocol.

3. The system recited in claim 1, wherein the circuit design model, the first subunit and the protocol-specific message capture unit are implemented in a reconfigurable hardware modeling device.

4. The system recited in claim 3, wherein the reconfigurable hardware modeling device is a hardware emulator or an FPGA-based prototyping device.

5. The system recited in claim 1, wherein the second subunit sends out the messages using TCP/IP (Transmission Control Protocol and Internet Protocol).

6. The system recited in claim 1, wherein the protocol file for the protocol is an XML (Extensible Markup Language) file.

7. The system recited in claim 1, wherein the first subunit sends the messages to the second subunit using a one-way import DPI (Direct Programming Interface) call and the second subunit performs a flow control.

8. The system recited in claim 1, wherein the signals further comprise signals carrying second information for analyzing the messages by the analysis unit.

9. The system recited in claim 8, wherein the analyzing comprises combining the messages received from different channels into a single message.

10. The system recited in claim 8, wherein the analyzing comprises outputting the messages to be displayed in different GUI (graphic user interface) panes.

11. The system recited in claim 8, wherein the second information is added as a header section to the messages.

12. The system recited in claim 1, wherein the signals carrying information for processing the messages comprise a first signal indicating a start of a message, a second signal indicating an end of a message and a clock signal.

13. The system recited in claim 1, wherein the second subunit is configured to perform flow control.

14. The system recited in claim 1, wherein the protocol-independent interface unit comprises multiple pairs of the first subunit and the second subunit, each of the multiple pairs configured for use with one of the one or more communication channels.

15. A method, comprising:
capturing, by a protocol-specific message capture unit, messages conforming to a protocol while or after being transmitted over one or more communication channels between a circuit design model and one or more target devices of the circuit design model, both the circuit design model and the protocol-specific message capture unit implemented using a hardware description language (HDL);
processing the messages by a protocol-independent interface unit based on signals received from the protocol-specific message capture unit, wherein the protocol-independent interface unit comprises a first subunit implemented using the hardware description language (HDL) and a second subunit implemented using a high-level language, the first subunit configured to receive signals from the protocol-specific message capture unit, the signals comprising signals carrying the messages and signals carrying information for processing by the protocol-independent interface unit, and wherein the processing comprises:
buffering the messages in one or more buffers in the first subunit,
receiving the messages by the second subunit from the first subunit, and
sending out the messages by the second subunit; and
analyzing, by an analysis unit running in a computer, the messages received from the second subunit, wherein the analyzing comprises: outputting the messages based on a protocol file for the protocol.

16. The method recited in claim 15, further comprising:
displaying the messages outputted by the analysis unit on a display unit, wherein the displaying is according to GUI (graphic user interface) layout information extracted by the analysis unit from the protocol file for the protocol.

17. The method recited in claim 15, wherein the circuit design model, the first subunit and the protocol-specific message capture unit are implemented in a reconfigurable hardware modeling device.

18. The method recited in claim 17, wherein the reconfigurable hardware modeling device is a hardware emulator or an FPGA-based prototyping device.

19. The method recited in claim 15, wherein the second subunit sends out the messages using TCP/IP (Transmission Control Protocol and Internet Protocol).

20. The method recited in claim 15, wherein the protocol file for the protocol is an XML (Extensible Markup Language) file.

21. The method recited in claim 15, wherein the signals further comprise signals carrying second information for analyzing the messages by the analysis unit.

22. The method recited in claim 21, wherein the analyzing comprises combining the messages received from different channels into a single message.

23. The method recited in claim 21, wherein the analyzing comprises outputting the messages to be displayed in different GUI (graphic user interface) panes.

24. The method recited in claim 21, wherein the second information is added as a header section to the messages.

25. The method recited in claim 15, wherein the first subunit sends the messages to the second subunit using a one-way import DPI (Direct Programming Interface) call and the second subunit performs a flow control.

26. The method recited in claim 15, wherein the second subunit performs flow control.

27. The method recited in claim 15, wherein the protocol-independent interface unit comprises multiple pairs of the first subunit and the second subunit, each of the multiple pairs used with one of the one or more communication channels.

* * * * *